(12) United States Patent
Lloyd et al.

(10) Patent No.: US 8,754,684 B1
(45) Date of Patent: Jun. 17, 2014

(54) PULSE MATCHING DELAY-LOCKED LOOP

(75) Inventors: Russell B. Lloyd, Middleton, ID (US);
Randal Q. Thornley, Nampa, ID (US)

(73) Assignee: IXYS CH GmbH (CH)

( * ) Notice: Subject to any disclaimer, the term of this patent is extended or adjusted under 35 U.S.C. 154(b) by 1261 days.

(21) Appl. No.: 12/286,562

(22) Filed: Sep. 30, 2008

(51) Int. Cl.
*H03L 7/06* (2006.01)

(52) U.S. Cl.
USPC .......................................... 327/158

(58) Field of Classification Search
USPC .......................................... 327/158
See application file for complete search history.

(56) References Cited

U.S. PATENT DOCUMENTS

| | | | |
|---|---|---|---|
| 6,456,130 B1 | 9/2002 | Schnell | 327/156 |
| 7,109,767 B1 | 9/2006 | Amick et al. | 327/158 |
| 7,157,949 B2 | 1/2007 | Chen et al. | 327/158 |
| 7,579,889 B2 * | 8/2009 | Yang et al. | 327/158 |
| 2008/0136477 A1 * | 6/2008 | Yon | 327/158 |
| 2009/0295442 A1 * | 12/2009 | Kwak | 327/158 |

FOREIGN PATENT DOCUMENTS

JP  2007-314634  * 12/2007 ..................... 327/161

OTHER PUBLICATIONS

English translation for JP2007-314634, Mar. 2, 2011.*

* cited by examiner

*Primary Examiner* — Daniel Rojas
(74) *Attorney, Agent, or Firm* — Imperium Patent Works; T. Lester Wallace; Darien K. Wallace

(57) ABSTRACT

A delay-locked loop (DLL) involves a pulse generating circuit that generates first and second pulses from an input clock signal. The second pulse is generated one clock signal period later than the first pulse. The first pulse is supplied to the input of a delay line. An edge of a delayed version of the first pulse as output from the delay line is phase-aligned with respect to a corresponding edge of the undelayed second pulse such that the DLL locks. The sending of pulses through the delay line of the DLL rather than clock signals having more edges per unit time helps reduce DLL aliasing problems and reduces the amount of switching in the delay line, thereby reducing power consumption. A compact segmented delay line construction allows an input signal of arbitrary wave shape to be delayed by a fraction of the clock signal period.

13 Claims, 7 Drawing Sheets

INC = 1  SHIFT LEFT, SHIFT IN A ZERO AT RIGHT END OF SR
INC = 0  SHIFT RIGHT, SHIFT IN A ONE AT LEFT END OF SR

PORTION OF DELAY LINE CIRCUIT

LONGER DELAY

SHORTER DELAY

PULSE MATCHING DELAY-LOCKED LOOP

TECHNICAL FIELD

The described embodiments relate to delay-locked loops (DLLs).

BACKGROUND INFORMATION

Delay-locked loops (DLLs) are sometimes used in the delaying of a particular signal of arbitrary wave shape by a fraction of the period of another signal. FIG. 1 (Prior Art) is a diagram of a conventional delay-locked loop 1 usable for this purpose. The particular signal of arbitrary wave shape is signal SIN. The delayed version of SIN is signal SOUT. The other signal is the signal CLKIN. In operation, the signal CLKIN is passed through a variable delay line 2. The delay of delay line 2 is controlled to be equal to one period of the signal CLKIN. The signal CLKOUT that is output from the delay line is fed back to a second input of a phase detector 3. The signal CLKIN is supplied to a first input of phase detector 3. Phase detector 3 adjusts the delay of delay line 2 via the signal CONTROL1 such that the phase of an edge of the CLKOUT signal matches the phase of an edge of the signal CLKIN.

FIG. 2 (Prior Art) is a diagram that illustrates operation of DLL 1. The upper waveform illustrates the signal CLKIN. The rising edges of CLKIN are labeled A, B, C and D as illustrated. The next three waveforms down in the diagram represent three versions of CLKIN that are delayed by different amounts of time by delay line 2. The second waveform illustrates a situation in which delay line 2 delays CLKIN a lesser amount, the next waveform down illustrates a situation in which delay line 2 delays CLKIN a larger amount, and the third waveform down illustrates a situation in which delay line 2 delays CLKIN a still larger amount. The rising edge A in these three waveforms is the delayed version of the rising edge A of CLKIN shown in the top waveform. Note that in the waveform labeled CLKOUT (LOCKED) that first edge A of the delayed signal is phase-aligned with the second edge B of CLKIN. DLL 1 can lock in this condition and adjust the delay of delay line 2 such that this phase relationship between CLKOUT and edge B of CLKIN is maintained. In this lock condition, the delay through the delay line is one period of CLKIN.

In the example of FIG. 1, the value of control signal CONTROL1 that controls delay line 2 is known, as is the relationship of the delay of delay line 2 to the various possible values of CONTROL1. Accordingly, a mathematical operation can be performed on the value of CONTROL1 such that values of control signals CONTROL2 can control an identical delay line 4 (identical to delay line 2) such that the delay through delay line 4 is a desired fraction or percentage of the delay through delay line 2. The mathematical operation is represented in FIG. 1 by block 5. For example, if the signal SOUT is to be a delayed version of SIN where the delay is to be one half of the period of the period of CLKIN, then value CONTROL1 may be divided by two and the divided value may be used as CONTROL2 to control delay line 4.

The bottom three waveforms of FIG. 2 represent an undesirable condition that can sometimes occur, depending on the operation and design of the DLL. This condition is referred to here as "aliasing" or a "false lock". Rather than the delay through delay line 2 being one period of CLKIN, the delay through delay line 2 is two periods of CLKIN. Note that edge A of delayed signal CLKOUT in the bottom three waveforms is about two periods later than the corresponding edge A of the undelayed signal CLKIN in the upper waveform. The delayed edge A of CLKOUT aligns in time with the third rising edge C of signal CLKIN, rather than the second rising edge B of signal CLKIN. DLL 1 can lock in this condition. If block 5 operates in the same manner as in the non-aliased locking condition, then SOUT will be delayed with respect to SIN by the wrong amount of time. New circuits and techniques for preventing aliasing and false lock problems are sought.

SUMMARY

In a first aspect, a novel delay-locked loop (DLL) involves a pulse generating circuit that generates first and second pulses from a continuous periodic input clock signal. The second pulse is generated one clock signal period later than the first pulse. The first pulse is supplied to the input of a variable delay line. An edge of a delayed version of the first pulse as output from the variable delay line is then phase-aligned with respect to a corresponding edge of the undelayed second pulse such that the DLL locks. The delay through the variable delay line is dynamically adjusted to be locked at one period of the input clock signal.

This sending of pulses through the DLL's delay line rather than the sending of a continuous clock signal having more edges per unit time through the delay line as is conventional helps to reduce DLL aliasing problems. The sending of pulses through the delay line as opposed to a continuous clock signal also reduces the amount of switching in the delay line per unit time, thereby reducing power consumption. In one example of the novel DLL, only one pulse is propagating in the delay line at a given time.

In a second aspect, the delay line has a segmented delay line construction involving multiple delay line portions that are chained together. Each delay line portion is controlled by the same set of control signals generated by a single bidirectional shift register. When the delay of the overall delay line is increased, the delay of each delay line portion within it is increased by one delay element. The delay of the overall delay line therefore increases in delay element delays by the number of delay line portions that are chained together to form to overall delay line. Similarly when the delay of the overall delay line is decreased, the delay of each delay line portion is decreased by one delay element. The delay of the overall delay line therefore decreases in delay element delays by the number of delay line portions chained together to form the overall delay line. The delay line architecture involving multiple chained-together delay line portions that are controlled by one common set of control lines coming from one bidirectional shift register allows an input signal SIN of arbitrary wave shape to be delayed by a fraction of the clock signal period. To perform this delaying of the input signal SIN of arbitrary wave shape, a second delay line is provided. The second delay line is substantially identical to one of the delay line portions. The second delay line is used to delay the input signal SIN of arbitrary wave shape, and is controlled by the same control signals and same single bidirectional shift register that control each of the delay line portions. As a result, the output of the second delay line is delayed by a fraction of the input clock signal period, where the fraction is a function of the number of delay line portions that are chained together to form the delay line in the DLL's control loop. If for example, there are four delay line portions that are chained together to form the delay line, then the second delay line delays the input signal SIN by one fourth of the input clock signal period.

In one example, the number of delay line portions that are chained together to form the overall delay line is user programmable such that the fractional clock period delay of the second delay line is also user programmable. The simplicity of the circuitry that results in the generation of a fractional input clock signal period delay sees use in memory controller applications including double data rate synchronous dynamic random access memories (DDR SDRAMs). The control of the multiple delay line portions using a single bidirectional shift register having a smaller number of cells than the number of delay elements in the overall delay line reduces size of the delay line as compared to design's in which the number of cells in the bidirectional shift register is the same as the number of delay elements in the delay line.

In a third aspect, a DLL as described above is provided on a microcontroller integrated circuit for a dedicated purpose such as, for example, the generation of delayed signals for supplying to an on-chip DDR SDRAM memory controller. Programmable multiplexing and demultiplexing circuitry is also provided, however, for coupling the SIN, CLKIN, and SOUT signals of the DLL to corresponding I/O terminals of the microcontroller integrated circuit such that the DLL is usable as a versatile general purpose DLL. The programmable multiplexing and demultiplexing circuitry is controllable by software or firmware of the microcontroller by writing to appropriate control registers. The content of the control registers in turn controls the multiplexing and demultiplexing circuitry. Through this control register and programmable multiplexing and demultiplexing circuitry, the on-chip DLL can be interfaced to circuitry outside the microcontroller integrated circuit in the event the DLL is not needed for the dedicated on-chip memory controller function.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 3:
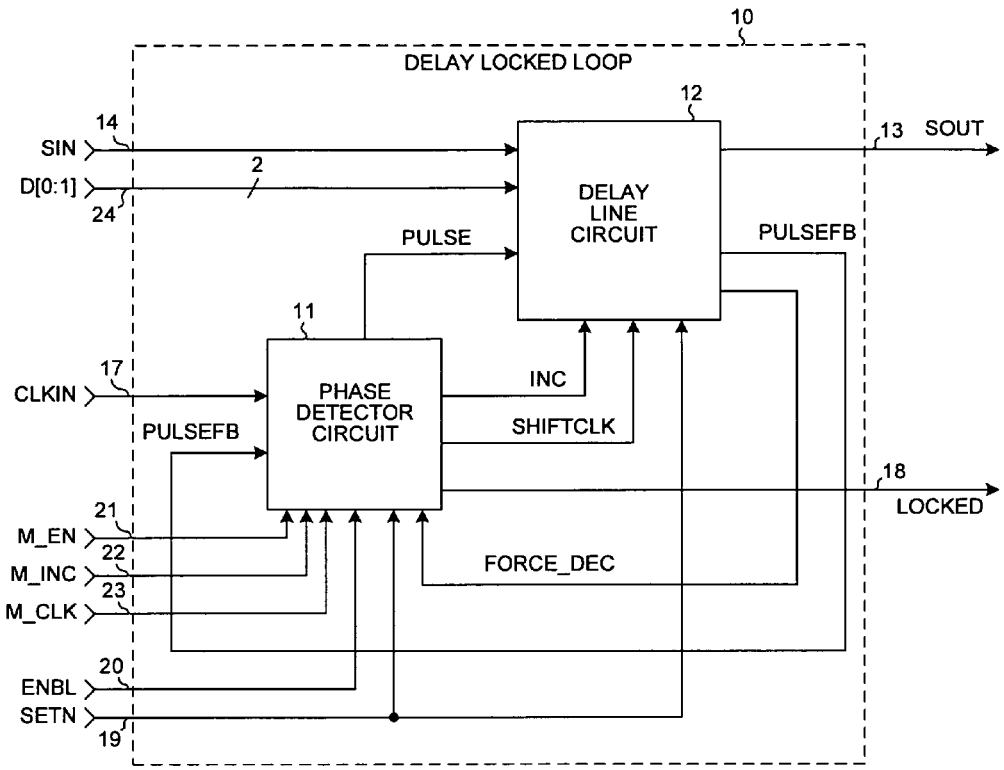
FIG. 3 is a simplified block diagram of a delay-locked loop (DLL) in accordance with one novel aspect.

FIG. 3 is a simplified block diagram of a delay-locked loop (DLL) 10 in accordance with one novel aspect. DLL 10 includes a phase detector circuit 11 and a delay line circuit 12.

Figure 1:
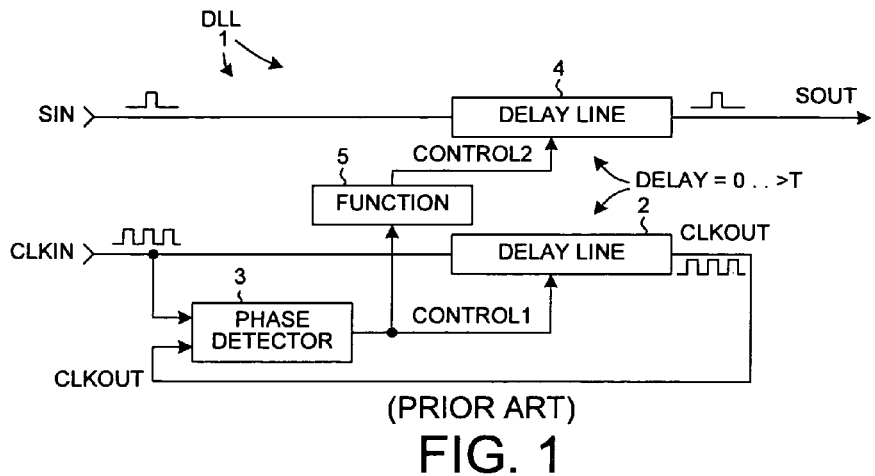
FIG. 1 (Prior Art) is a diagram of one type of conventional delay-locked loop (DLL).
Figure 2:
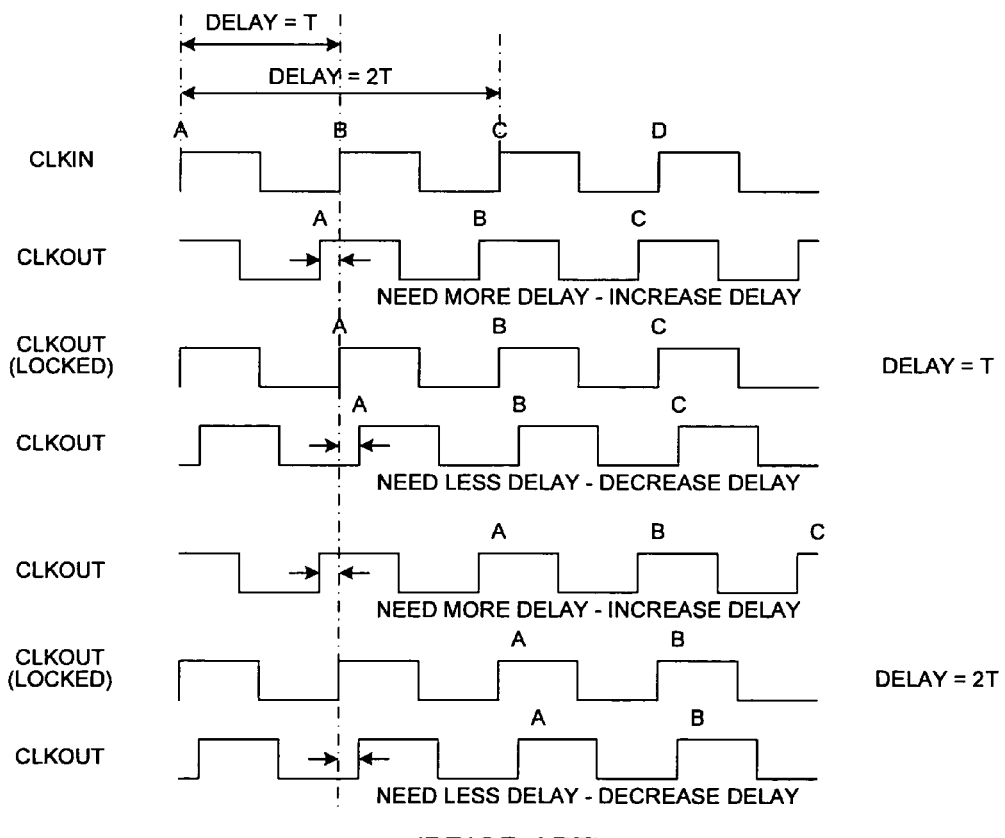
FIG. 2 (Prior Art) is a waveform diagram that illustrates an aliasing problem exhibited by the conventional. DLL of FIG. 1.
Figure 4:
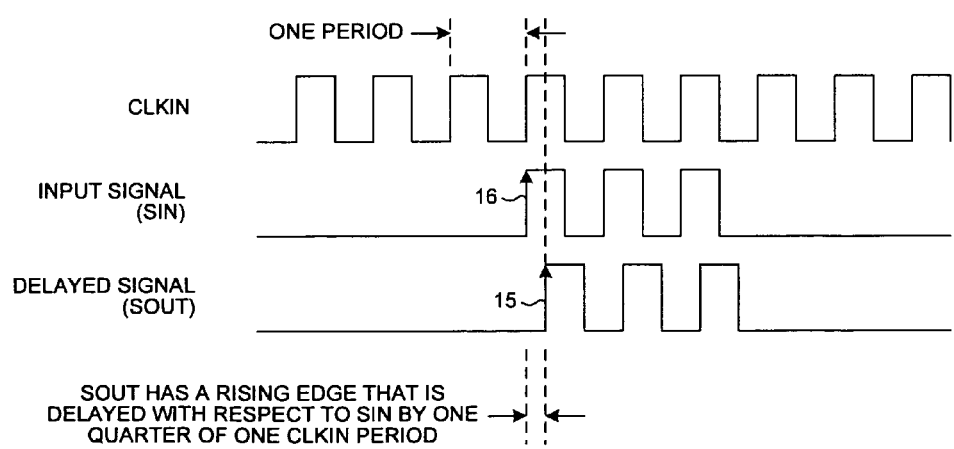
FIG. 4 is a waveform diagram that illustrates how the DLL of FIG. 3 is usable to delay an input signal SIN of arbitrary wave shape by one quarter of the period of a clock signal CLKIN.

FIG. 4 is a waveform that illustrates an operation of DLL 10 of FIG. 1. In one example, DLL 10 is to operate such that DLL 10 delays a signal of arbitrary wave shape SIN by a programmable percentage or fraction of the period of an input clock signal CLKIN. In the waveform of FIG. 4, the signal SOUT output by DLL 10 on lead 13 is a delayed version of the signal SIN of arbitrary wave shape received by DLL 10 on lead 14. DLL 10 operates such that the delay is one quarter of the period of CLKIN as illustrated in FIG. 4. In one example, the signal SOUT is a signal supplied to a memory controller, where the memory controller sends timed control signals to an external memory device such as a synchronous dynamic random access memory (SDRAM) having a double data rate (DDR) interface. DLL 10 allows the rising edge 15 of the signal SOUT sent to the memory controller to be delayed in time (with respect to the rising edge 16 of signal SIN) by a programmable amount of time.

In FIG. 3, the CLKIN signal is received on lead 17. A signal LOCKED that indicates whether DLL 10 is locked or not is output onto lead 18. A signal SETN is an active low reset signal that, when asserted, initializes DLL 10. SETN is received onto DLL 10 via lead 19. DLL 10 can be disabled such that its internal circuitry does not switch and consume power. Disabling DLL 10 in this fashion reduces power consumption in the event that the function of DLL 10 is not required in a circuit application. To disable DLL 10, the active high signal ENBL is deasserted to a digital logic low value. The signal ENBL is received by DLL 10 via terminal 20. The delay by which signal SIN is delayed in the generation of the signal SOUT can be controlled in a delay-locked loop fashion using a phase detector, or alternatively the amount of delay can be set by an external source by driving signals M_EN, M_INC and M_CLK. The signals M_EN, M_INC and M_CLK are received onto DLL 10 via leads 21, 22 and 23, respectively. In the particular example of FIG. 3, whether SIN is delayed by one third of the CLKIN period, one quarter of the CLKIN period, or one fifth of the CLKIN period is determined by a two-bit digital value D[0:1] that is received onto DLL 10 via leads 24.

Figure 5:
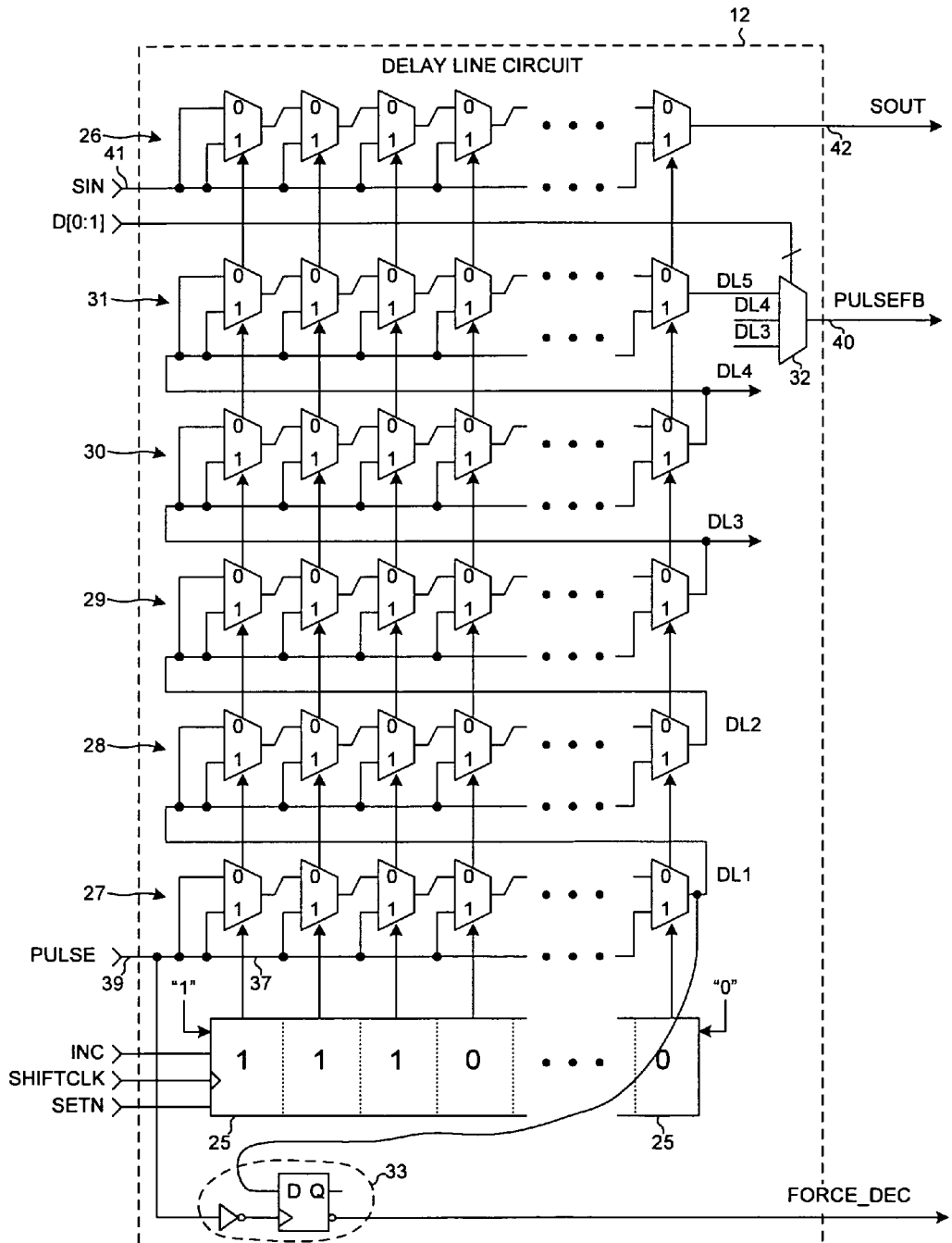
FIG. 5 is a simplified diagram of the delay line circuit 12 of the DLL of FIG. 3.

FIG. 5 is a more detailed diagram of delay line circuit 12 of FIG. 3. Delay line circuit 12 includes a bidirectional shift register 25, a first delay line and a second delay line 26. The first delay line includes five delay line portions 27-31, a multiplexing circuit 32, and a force decrement circuit 33. Each of the delay line portions in FIG. 5 is illustrated as a horizontally extending row of chained multiplexers. Delay line portion 27, for example, is the lowermost row of horizontally extending multiplexers. The signal output by delay line portion 27 is designated DL1. Bidirectional shift register 25 includes multiple cells as illustrated. The numerals "1" and "0" illustrated in the various cells of the shift register in FIG. 5 indicate the digital logic value contents of the cells.

Figure 6:
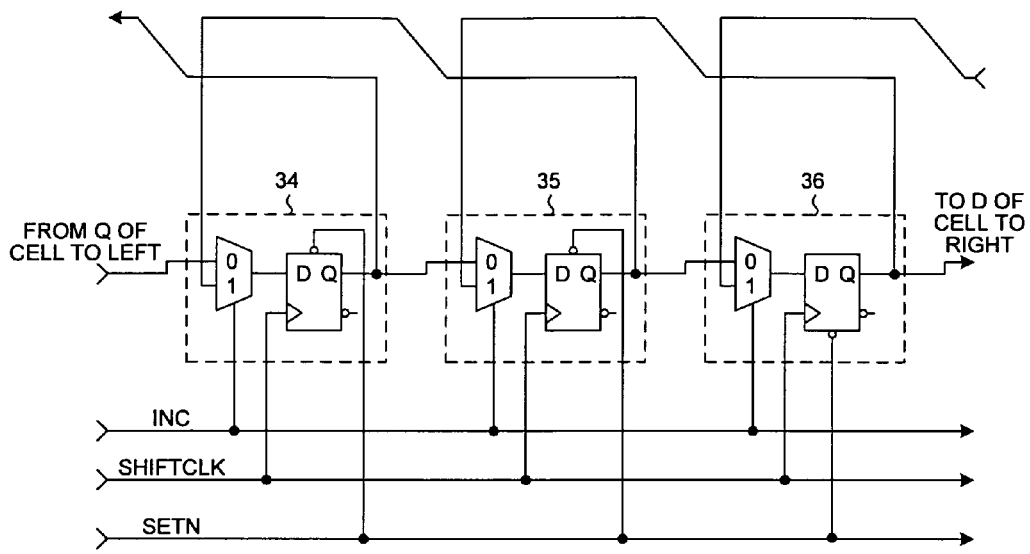
FIG. 6 is a diagram of a portion of the bidirectional shift register of the delay line circuit 12 of the DLL of FIG. 3.

FIG. 6 illustrates three cells 34-36 of bidirectional shift register 25 in further detail. If the digital signal INC is asserted high when signal SHIFTCLK transitions high, then the multiplexer of a cell supplies the D-input of the D flip-flop of the cell with the value output by the cell to the right. The result is a shifting left of the values in the various cells of the shift register. If, however, the digital signal INC is low when signal SHIFTCLK transitions high, then the multiplexer of the cell supplies the D-input of the D flip-flop of the cell with the value output by the cell to the left. The result is a shifting right of the values in the various cells of the shift register. The values in the cells can be asynchronously set at one time by asserting SETN to a digital logic low level. Asserting SETN low causes the cells on the left side of the shift register to be loaded with digital "1" values and causes the cells on the right side of the shift register to be loaded with digital "0" values. Once the cells are asynchronously loaded and the SETN signal is returned to a high value, then the horizontal boundary between "1" values and "0" values as stored in the horizontally extending shift register can be moved to the left and can be moved to the right by appropriate control of the INC and SHIFTCLK signals.

Figure 7A:
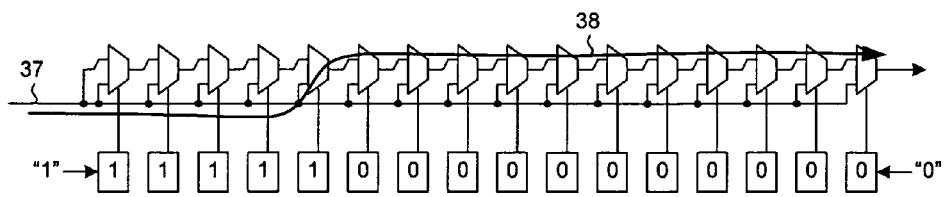
FIGS. 7A and 7B are diagrams that illustrate how shifting the bidirectional shift register of the delay line in one direction and the other direction results in the delay of a delay line portion being made longer and shorter.
Figure 7B:
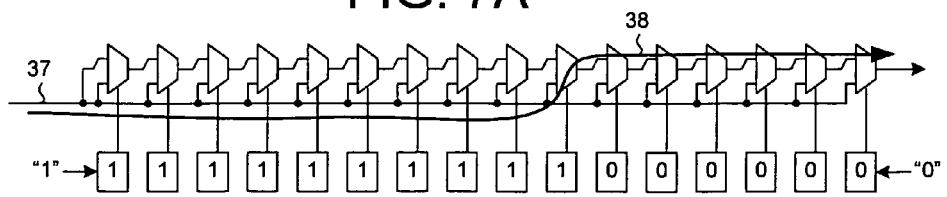

FIGS. 7A and 7B illustrate how the shifting to the left of the values in bidirectional shift register 25 results in increasing of the delay through a delay line portion, whereas a shifting to the right of the values in bidirectional shift register 25 results in a decreasing of the delay through a delay line portion. As indicated in FIG. 5, if the control value supplied to a multiplexer of a delay line portion is a digital logic high value, then the multiplexer couples a common input signal line 37 to the multiplexer output lead. If, however, the control value supplied to the multiplexer is a digital logic low value, then the multiplexer supplies the signal output by the multiplexer to the left onto the multiplexer output lead. Accordingly, as illustrated in FIG. 7A, cells that store "1" values cause their corresponding multiplexers to couple the input lead 37 through the last multiplexer to the right that contains a "1" into a chain of multiplexers extending to the right. The arrow 38 in FIG. 7A indicates the signal path. The signal is delayed by the propagation delays through the multiplexers to the right that store "0" values.

FIG. 7B illustrates the signal path 38 after the bidirectional shift register 25 has been shifted a few times to the right. Fewer multiplexers are now in the delay path in the situation of FIG. 7B as compared to the situation of FIG. 7A. Shifting the bidirectional shift register to the right therefore reduces the delay of the delay line portion, whereas shifting the bidirectional shift register to the left increases the delay of the delay line portion. Note that when the shift register 25 is shifted to the right, a "1" is shifted into the leftmost cell so that all cells on the left of the shift register contain digital "1" values. Similarly, when the shift register 25 is shifted to the left, a "0" is shifted into the rightmost cell so that all cells to the right of the shift register contain digital "0" values.

As illustrated in FIG. 5, the control output signals from the one bidirectional shift register 25 control all five of the delay line portions 27-31 of the delay line in parallel. Each of these delay line portions is of substantially identical construction. The delays through these delay line portions are therefore also substantially identical. Shifting shift register 25 one time to the right therefore results in the delay through each delay line portion being reduced one multiplexer delay. Shifting shift register 25 one time to the left therefore results in the delay through each delay line portion being increased one multiplexer delay. Note that the delay line portions 27-31 are chained together such that the output signal DL1 on the output lead of the first delay line portion 27 is supplied to the input lead of the second delay line portion 28, and the output signal DL2 on the output lead of the second delay line portion 28 is supplied to the input lead of the third delay line portion 29, and so forth. The input lead of the first delay line portion 27 is coupled to the input lead 39 of the overall delay line. The output lead of a selected one of delay line portions 29-31 can be coupled through multiplexer 32 to the output lead 40 of the overall delay line. How many delay line portions (three, four, or five) are in the signal path through the overall delay line is determined by the two-bit digital value D[0:1] that controls multiplexer 32.

Assuming, for explanation purposes, that four delay line portions 27-30 are chained together to be in the signal path through the delay line, then the first delay line portion 27 would delay the input signal received on lead 39 by one quarter of the total amount that the overall delay line delays the signal between input lead 39 and output lead 40. If, however, three delay line portions 27-29 are in the signal path through the delay line, then the first delay line portion 27 would delay the input signal received on lead 39 by one third of the total amount that the overall delay line delays the signal between input lead 39 and output lead 40. Similarly, if five delay line portions 27-31 are in the signal path through the delay line, then the first delay line portion 27 would delay the input signal received on lead 39 by one fifth of the total amount that the overall delay line delays the signal between input lead 39 and output lead 40.

In addition to the five chained together delay line portions 27-31, the delay line circuit 12 of FIG. 5 includes second delay line 26. The second delay line 26 is of identical construction to one of the delay line portions. The second delay line 26 is also controlled by the control signals output by shift register 25 in the same way that the delay line portions are controlled by the control signals. The delay through the second delay line 26 is therefore the same as the delay through one of the delay line portions 27-31. If the delay between input lead 39 and output lead 40 is phase-locked to be equal to one period of CLKIN, then the delay through second delay line 26 is equal to one third, one quarter, or one fifth of the CLKIN period depending on the value of D[0:1]. Unlike the delay line portions 27-31, the input lead 41 of the second delay line 26 is available for receiving any signal SIN of arbitrary wave shape. The output lead 42 therefore outputs signal SOUT that is a delayed version of the SIN, where the delay is a programmable one of either one third, one quarter, or one fifth of the CLKIN period.

Figure 8:
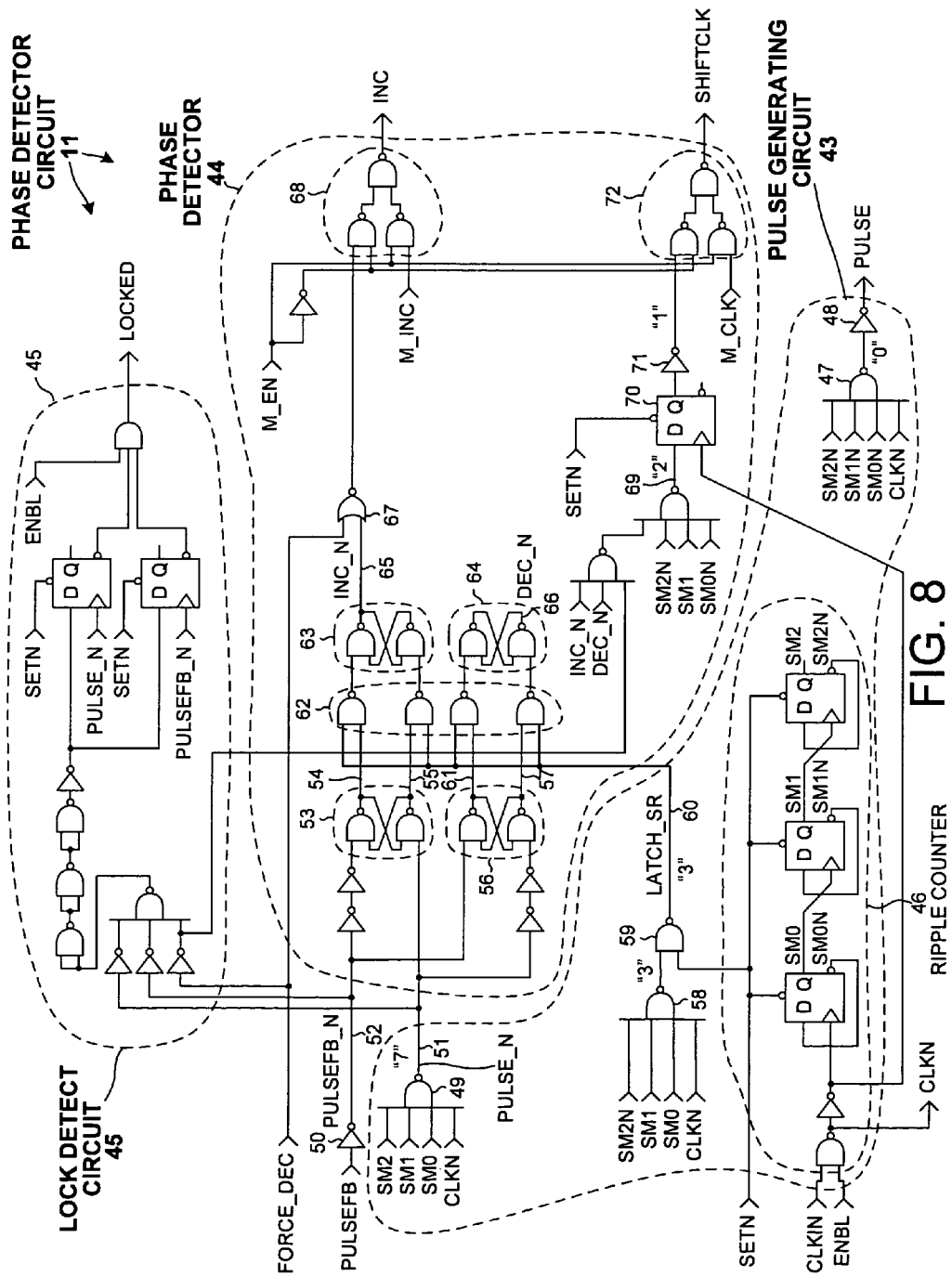
FIG. 8 is a more detailed circuit diagram of the phase detector circuit 11 of the DLL of FIG. 3.

FIG. 8 is a block diagram of phase detector circuit 11 of FIG. 3. Phase detector circuit 11 includes a pulse generating circuit 43, a phase detector 44, and a lock detect circuit 45.

Figure 9:
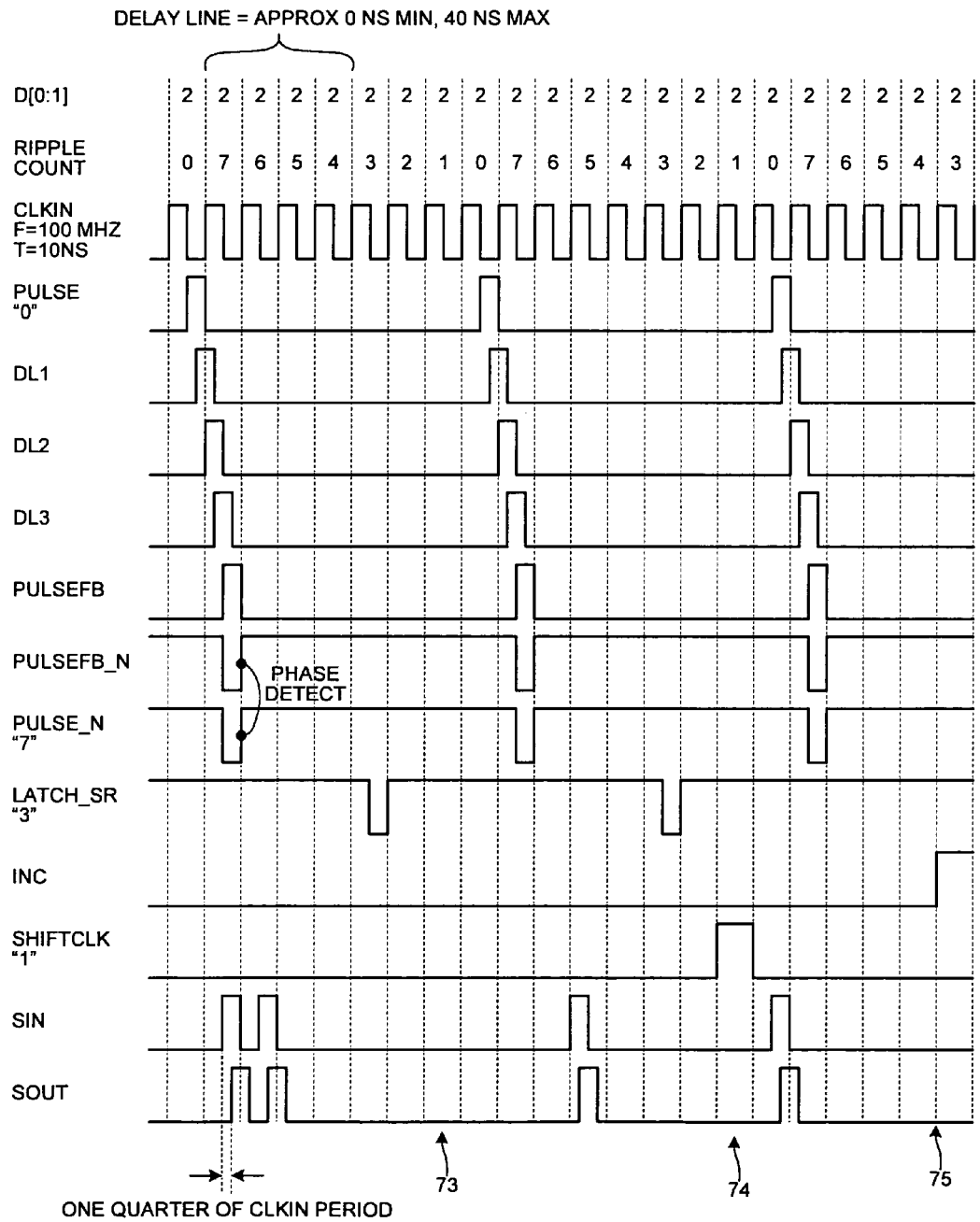
FIG. 9 is a simplified waveform diagram that illustrates an operation of the DLL of FIG. 3.

FIG. 9 is a waveform diagram that illustrates an operation of DLL 10 of FIG. 3 and of the phase detector circuit 11 of FIG. 3. Pulse generating circuit 43 includes a three-bit asynchronous count-down ripple counter 46 that changes count states on successive rising edges of CLKIN. Logic gates 47 and 48 detect the count state "0" of the ripple counter and generate an active high signal PULSE during this "0" count state when the CLKIN signal is low as illustrated in FIG. 9. As indicated in FIG. 3, this PULSE signal is supplied to the input of delay line circuit 12. As indicated in FIG. 5, this signal PULSE is supplied onto the input of the first delay line at input lead 39. As indicated in FIG. 5, the output signal from the first delay line on lead 40 is signal PULSEFB. As illustrated in FIG. 8, signal PULSEFB is inverted by inverter 50 to generate PULSEFB_N.

In addition to generating the first pulse signal PULSE, pulse generating circuit 43 also generates a second pulse signal PULSE_N. Pulse generating circuit 43 includes a logic gate 49 that detects the count state "7" of the ripple counter and generates the active low signal PULSE_N onto conductor 51. PULSE_N pulses low during the "7" state when CLKIN is low. The ripple counter is a three-bit down counter, so the "7" count state occurs one count state later than the "0" count state. The second pulse PULSE_N therefore pulses low one CLKIN period after the second pulse signal PULSE pulses high.

Phase detector 44 of FIG. 8 determines a phase relationship between the delayed first pulse signal PULSEFB_N on conductor 52 and the undelayed second pulse signal PULSE_N on conductor 51. In a starting condition during the second part of ripple count period "7", both signals PULSEFB_N and PULSE_N are low. Both outputs of RS latch 53 are therefore high. Then at a later time at the end of ripple count period "7"

if PULSE_N transitions high more than two inverter delays after signal PULSEFB_N, then RS latch 53 latches such that a digital low is present on output 54 and a digital high is present on output 55. If, however, PULSE_N were to transition high less than two inverter delays after signal PULSEFB_N, then RS latch 53 would latch such that a digital high would be present on output 54 and a digital low would be present on output 55. Accordingly, the signal on output 54 is low if the low-to-high transition of PULSEFB_N occurred is more than two inverter delays behind the low-to-high transition of PULSE_N. RS latch 56 operates in a similar fashion, except that the signal on output 57 is low if the low-to-high transition of PULSEFB_N is more than two inverter delays ahead of the low-to-high transition of PULSE_N.

If the low-to-high transition of PULSEFB_N is more than two inverter delays behind the low-to-high transition of PULSE_N, then the delay of the first delay line should be reduced to make PULSEFB_N transition high sooner to better align the phases of the PULSEFB_N and PULSE_N signals. If the low-to-high transition of PULSEFB_N is more than two inverter delays ahead of the low-to-high transition of PULSE_N, then the delay of the delay line should be increased to make PULSEFB_N transition high later to better align the phases of the PULSEFB_N and PULSE_N signals.

The latching states of RS latches 53 and 56 are stable at the end of counter state "7" and are certainly stable by counter state "3". Logic gates 58 and 59 generate a LATCH_SR signal on conductor 60 that allows the states of the RS latches on conductors 54, 55, 61 and 57 to pass through NAND gates 62 and to latch SR latches 63 and 64. After the latching of SR latches 63 and 64 at the end of count state "3", if SR latch 63 is latched such that signal INC_N is low on conductor 65 then the delay of the delay line should be increased. If, however, SR latch 64 is latched such that signal DEC_N is low on conductor 66 then the delay of the delay line should be decreased.

The bidirectional shift register 25 of the delay line (see FIG. 5) receives the signals INC and SHIFTCLK that appear at the right of FIG. 8. SHIFTCLK clocks the shift register, so if SHIFTCLK does not transition high then the state of the shift register does not change. If SHIFTCLK transitions high, then the shift register shifts to the left (increase delay) if INC is high, otherwise the shift register shifts to the right (decrease delay). If manual enable signal M_EN is not asserted (is high) and FORCE_DEC is not asserted (i.e., is low), then the active low signal value of INC_N is inverted by NOR gate 67 to be a digital high value, and this digital high value passes through multiplexing gates 68, and asserts the increase delay signal INC high.

Phase detector 44 of FIG. 8, however, has a phase deadband in which the phases of PULSEFB_N and PULSE_N are so close in phase that the shift register 25 is not shifted in either direction. If during count state "2" either INC_N or DEC_N is low, then the signal on conductor 69 is low. This low signal passes through flip-flop 70 starting at the rising edge of CLKIN and remains being output on the Q output of flip-flop 70 for one period of CLKIN. This low pulse on the Q output of flip-flop 70 is inverted by inverter 71 and passes as a high pulse through multiplexing gates 72 to assert SHIFTCLK high for one CLKIN period. In the example of the waveform diagram of FIG. 9, SHIFTCLK does not pulse high during period 73 because the phases of PULSEFB_N and PULSE_N are determined to be adequately phase aligned. In the period 74, however, SHIFTCLK does pulse high because in the previous cycle flip-flop 70 clocked in a digital low value. This digital low value was asserted on conductor 69 due to the phases of PULSEFB_N and PULSE_N being adequately out of phase to warrant changing the delay of the first delay line. It is therefore seen that the shift register 25 is only clocked by SHIFTCLK if the phases of PULSEFB_N and PULSE_N are adequately out of phase with respect to each other. In the example of FIG. 9, the rising edge of SHIFTCLK causes shift register 25 to shift, and changes the delay of the first delay line such that increase delay signal INC transitions from low to high at time 75. INC being a digital logic high means that it is no longer necessary to increase the delay of the first delay line.

As illustrated in the waveform of FIG. 9, the signal SIN (that is delayed by second delay line 26 of FIG. 5 to generate output signal SOUT) can have an irregular and arbitrary wave shape. Because the value D[0:1] is a digital "2" as illustrated in FIG. 9, multiplexer 32 of FIG. 5 selects the second data input lead carrying the DL4 signal. There are therefore four delay line portions in the signal path of the overall first delay line. Accordingly, the second delay line 26 delays SIN by one quarter of the period of CLKIN.

In one advantageous aspect, instead of using CLKIN or a continuous roughly 50/50 duty cycle clock signal as an input clock to which the feedback signal is locked, the novel DLL 10 sends a single pulse through the delay line and then phase-locks to the delayed version of this pulse. The pulse is followed by a no-pulse time that is so long with respect to the delay of the delay line that only one pulse can be propagating in the delay line at a time. The phase-locking of this delayed pulse to another undelayed similar pulse helps prevent aliasing in the DLL. In one example, the second pulse (PULSE_N signal) to which the delayed version of the first pulse (PULSE signal) is phase-compared has two and only two edges for a time of at least four clock periods of the signal CLKIN. Similarly, the first signal PULSE has two and only two edges for a time of at least four clock periods of the signal CLKIN.

In another advantageous aspect, the sending of single pulses through the first delay line rather than a continuous clock signal that has more transitions per unit time reduces the number of times that circuitry in the DLL switches. Due to the reduction in switching, DLL power consumption is reduced.

Figure 10:
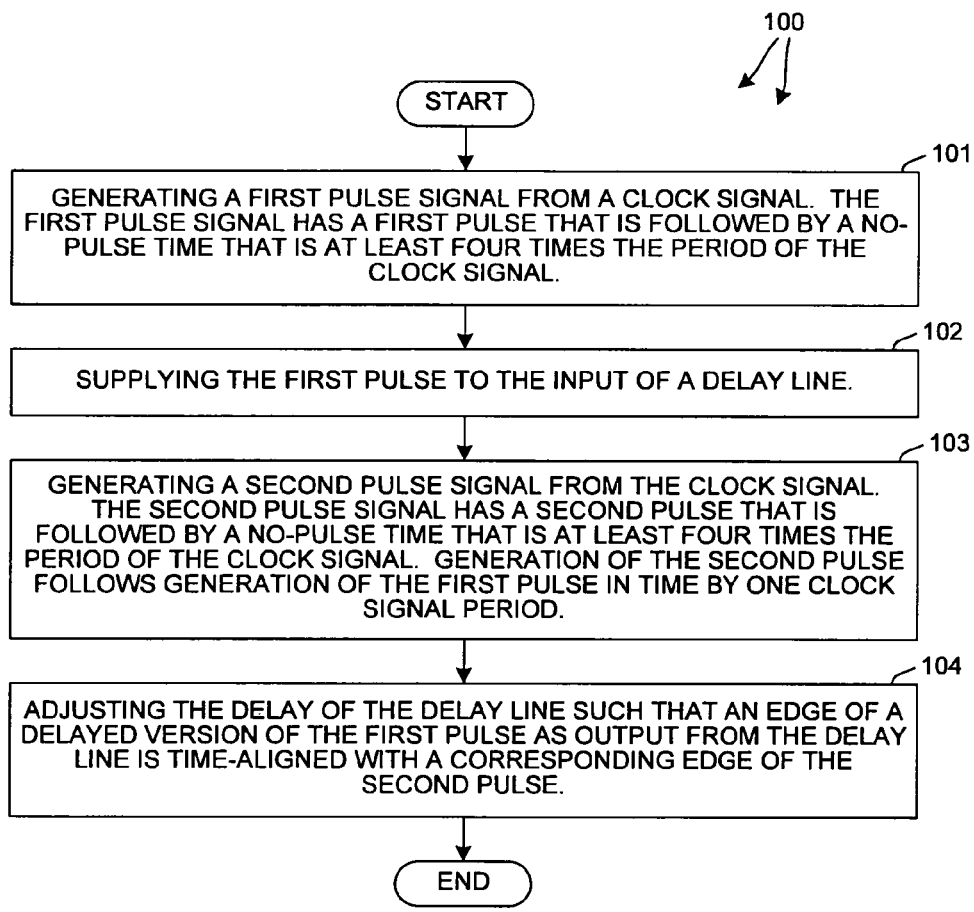
FIG. 10 is a flowchart of a method in accordance with one novel aspect.

FIG. 10 is a simplified flowchart of a novel method 100. A first pulse signal is generated (step 101) from a clock signal. In one example, the first pulse signal has a first pulse that is followed by a no-pulse time that is at least four times the period of the clock signal. The first pulse signal is supplied (step 102) to the input of a delay line. A second pulse signal is generated (step 103) from the clock signal. In one example, the second pulse signal has a second pulse that is followed by a no-pulse time that is at least four times the period of the clock signal. Generation of the second pulse follows generation of the first pulse in time by one clock signal period. The delay of the delay line is adjusted (step 104) such that an edge of a delayed version of the first pulse as output from the delay line is time-aligned with a corresponding edge of the undelayed second pulse.

Although the novel DLL is described above in connection with certain exemplary embodiments, the present invention is not limited thereto. The first and second pulses need not be time-separated from one another by one CLKIN period, but rather may in other embodiments be time-separated by another integer number of CLKIN periods. The first and second pulse signals need not be followed by no-pulse times that are four times the period of the clock signal, but rather in some circuits the first and second pulse signals are followed by no-pulse times of other durations. Accordingly, various modifications, adaptations, and combinations of various features of the described embodiments can be practiced without departing from the scope of the invention as set forth in the claims.

What is claimed is:

1. A method comprising:
   (a) generating a first pulse signal from a clock signal, wherein the first pulse signal has two and only two edges in a time period of at least four periods of the clock signal, wherein the two edges are edges of a first pulse;
   (b) generating a second pulse signal from the clock signal, wherein the second pulse signal has two and only two edges in a time period of at least four periods of the clock signal, wherein the two edges are edges of a second pulse, wherein the second pulse is generated later in time with respect to the first pulse;
   (c) passing the first pulse signal through a delay line to generate a feedback pulse signal; and
   (d) adjusting a delay of the delay line such that an edge of the feedback pulse signal is time-aligned with a corresponding edge of the second pulse signal, wherein (a) involves detecting a first count state of a counter, and wherein (b) involves detecting a second count state of the counter, wherein the counter is clocked by the clock signal.

2. A method comprising: (a) generating a first pulse signal from a clock signal, wherein the first pulse signal has two and only two edges in a time period of at least four periods of the clock signal, wherein the two edges are edges of a first pulse; (b) generating a second pulse signal from the clock signal, wherein the second pulse signal has two and only two edges in a time period of at least four periods of the clock signal, wherein the two edges are edges of a second pulse, wherein the second pulse is generated later in time with respect to the first pulse, and wherein each pulse of the first pulse signal is offset in time from the immediately following later pulse of the second pulse signal by the same integer number of periods of the clock signal; (c) passing the first pulse signal through a delay line to generate a feedback pulse signal; and (d) adjusting a delay of the delay line such that an edge of the feedback pulse signal is time-aligned with a corresponding edge of the second pulse signal; wherein (d) involves:
   (d1) shifting a shift register in a first direction if a first phase relationship exists between the feedback pulse signal and the second pulse signal, wherein the shift register outputs a plurality control signals;
   (d2) shifting the shift register in a second direction if a second phase relationship exists between the feedback pulse signal and the second pulse signal;
   (d3) using the control signals to change a delay of a first portion of the delay line;
   (d4) using the same control signals used in (d3) to change a delay of a second portion of the delay line, wherein the delay of the first portion of the delay line is substantially identical to the delay of the second portion of the delay line; and
   (d5) supplying a signal output from an output lead of the first portion of the delay line to an input lead of the second portion of the delay line.

3. The method of claim 2, further comprising:
   (e) providing a second delay line capable of delaying an input signal of an arbitrary shape and thereby generating a delayed version of the input signal, wherein the second delay line is controlled by the control signals in the same way that the control signals control the first portion of the delay line in (d3), and wherein the second delay line and the first portion of the delay line are of substantially identical construction.

4. A method comprising:
   (a) generating a first pulse signal from a clock signal, wherein the first pulse signal has two and only two edges in a time period of at least four periods of the clock signal, wherein the two edges are edges of a first pulse, wherein (a) involves:
      (a1) supplying the clock signal to a counter; and
      (a2) detecting a count state of the counter and in response generating the first pulse;
   (b) generating a second pulse signal from the clock signal, wherein the second pulse signal has two and only two edges in a time period of at least four periods of the clock signal, wherein the two edges are edges of a second pulse, wherein the second pulse is generated later in time with respect to the first pulse;
   (c) passing the first pulse signal through a delay line to generate a feedback pulse signal; and
   (d) adjusting a delay of the delay line such that an edge of the feedback pulse signal is time-aligned with a corresponding edge of the second pulse signal.

5. A method comprising: (a) generating a first pulse signal from a clock signal, wherein the first pulse signal has two and only two edges in a time period of at least four periods of the clock signal, wherein the two edges are edges of a first pulse; (b) generating a second pulse signal from the clock signal, wherein the second pulse signal has two and only two edges in a time period of at least four periods of the clock signal, wherein the two edges are edges of a second pulse, wherein the second pulse is generated later in time with respect to the first pulse, and wherein each pulse of the first pulse signal is offset in time from the immediately following later pulse of the second pulse signal by the same integer number of periods of the clock signal; (c) passing the first pulse signal through a delay line to generate a feedback pulse signal; and (d) adjusting a delay of the delay line such that an edge of the feedback pulse signal is time-aligned with a corresponding edge of the second pulse signal;
   (e) passing an input signal through a second delay line and thereby generating a delayed version of the input signal, wherein the delay line includes a programmable number of delay line portions, wherein each of the delay line portions has a substantially identical construction, and wherein each of the delay line portions has a substantially identical construction to the second delay line; and
   (f) using a common set of control signals to adjust a delay of each delay line portion and to adjust a delay of the second delay line, wherein the delays of the delay line portions and the delay of the second delay line are all substantially identical.

6. The method of claim 5, wherein the delayed version of the input signal is a memory control signal.

7. The method of claim 5, wherein the input signal is a control signal that has a substantially non-periodic wave shape.

8. A circuit, comprising: a pulse generating circuit that receives a clock signal and generates therefrom a first pulse signal and a second pulse signal, wherein each of the first pulse signal and the second pulse signal has two and only two edges in a time period of at least four periods of the clock signal, wherein each pulse of the second pulse signal is offset in time from the immediately preceding pulse of the first pulse signal by the same integer number of periods of the clock signal; a delay line that receives the first pulse signal and outputs a delayed version of the first pulse signal; and a phase detector that receives the delayed version of the first pulse signal and the second pulse signal, and that supplies a delay line control signal to the delay line; wherein the delay line includes:
- a bidirectional shift register that includes a plurality of cells, each cell outputting a respective control signal;
- a first delay line portion that includes a first plurality of delay elements, wherein each of the delay elements of the first delay line portion receives a corresponding one of the control signals output by the cells of the shift register; and
- a second delay line portion that includes a second plurality of delay elements, wherein each of the delay elements of the second delay line portion receives a corresponding one of the control signals output by the cells of the shift register, and wherein an output lead of the first delay line portion is coupled to an input lead of the second delay line portion.

9. A circuit, comprising: a pulse generating circuit that receives a clock signal and generates therefrom a first pulse signal and a second pulse signal, wherein each of the first pulse signal and the second pulse signal has two and only two edges in a time period of at least four periods of the clock signal, wherein each pulse of the second pulse signal is offset in time from the immediately preceding pulse of the first pulse signal by the same integer number of periods of the clock signal; a delay line that receives the first pulse signal and outputs a delayed version of the first pulse signal; and a phase detector that receives the delayed version of the first pulse signal and the second pulse signal, and that supplies a delay line control signal to the delay line; wherein the delay line control signal is an increase delay signal, wherein the phase detector also outputs a shift clock signal, wherein the delay line includes a bidirectional shift register that shifts in a first direction if the increase delay signal has a first digital logic value while the shift clock signal transitions and that shifts in a second direction opposite the first direction if the increase delay signal has a second digital logic value while the shift clock signal transitions, and wherein the bidirectional shift register does not shift if the shift clock signal does not transition.

10. A circuit, comprising:
- a pulse generating circuit that receives a clock signal and generates therefrom a first pulse signal and a second pulse signal, wherein each of the first pulse signal and the second pulse signal has two and only two edges in a time period of at least four periods of the clock signal, wherein the second pulse signal is offset in time with respect to the first pulse signal by an integer number of periods of the clock signal, wherein the pulse generating circuit includes:
  - a counter;
  - first digital logic gates that detect a first count state of the counter and in response generate the first pulse signal; and
  - second digital logic gates that detect a second count state of the counter and in response generate the second pulse signal;
- a delay line that receives the first pulse signal and outputs a delayed version of the first pulse signal; and
- a phase detector that receives the delayed version of the first pulse signal and the second pulse signal, and that supplies a delay line control signal to the delay line.

11. A circuit comprising:
- means for receiving a clock signal and for generating therefrom a first pulse signal and a second pulse signal, wherein each pulse of the second pulse signal is offset in time from the immediately preceding pulse of the first pulse signal by the same integer number of periods of the clock signal, and wherein the means is also for receiving a delay control signal and for using the delay control signal to delay the first pulse signal by a delay and thereby generating a delayed first pulse signal; and
- a phase detector that receives the delayed first pulse signal and the second pulse signal and that supplies the delay control signal to the means for receiving.

12. The circuit of claim 11, further comprising:
- a delay line having a delay that is controlled by the means, wherein the delay of the delay line is a selectable one of a plurality of fractions of a period of the clock signal; and
- a plurality of input leads, wherein a multi-bit digital value present on the plurality of input leads determines which one of the plurality of fractions of a period the delay of the delay line will be.

13. The circuit of claim 11, wherein the means includes a delay line, wherein the delay line includes a plurality of delay line portions, each of the delay line portions being controlled by the same set of control signals, and wherein each of the delay line portions is controlled by the set of control signals to have a substantially identical delay.

\* \* \* \* \*